US008286578B2

(12) United States Patent
Leenders et al.

(10) Patent No.: US 8,286,578 B2
(45) Date of Patent: Oct. 16, 2012

(54) DEVICE FOR COATING A PERIPHERAL SURFACE OF A SLEEVE BODY

(75) Inventors: Luc Leenders, Herentals (BE); Willem Mues, Tremelo (BE); Jackie Duprez, Ghent (BE); Bart Verhoest, Niel (BE); Hilbrand Vanden Wyngaert, Grobbendonk (BE); Eddie Daems, Herentals (BE); Luc Vanmaele, Lochristi (BE)

(73) Assignee: Agfa Graphics NV, Mortsel (BE)

( * ) Notice: Subject to any disclaimer, the term of this patent is extended or adjusted under 35 U.S.C. 154(b) by 849 days.

(21) Appl. No.: 12/438,386

(22) PCT Filed: Sep. 18, 2007

(86) PCT No.: PCT/EP2007/059807

§ 371 (c)(1), (2), (4) Date: Feb. 23, 2009

(87) PCT Pub. No.: WO2008/034810

PCT Pub. Date: Mar. 27, 2008

(65) Prior Publication Data

US 2009/0241788 A1 Oct. 1, 2009

Related U.S. Application Data

(60) Provisional application No. 60/846,924, filed on Sep. 25, 2006.

(30) Foreign Application Priority Data

Sep. 18, 2006 (EP) .................................... 06120823

(51) Int. Cl.

| | |
|---|---|
| ***B05C 3/02*** | (2006.01) |
| ***B05B 5/00*** | (2006.01) |
| ***C08F 2/46*** | (2006.01) |
| ***C08J 7/18*** | (2006.01) |
| ***B41M 1/10*** | (2006.01) |
| ***H01L 21/00*** | (2006.01) |

(52) U.S. Cl. . 118/404; 118/641; 118/642; 118/DIG. 11; 427/487; 427/372.2; 101/170; 438/31; 438/33; 438/56

(58) Field of Classification Search .................. 118/404, 118/641, 642, DIG. 11; 427/487, 372.2; 101/170, 357.7; 430/31, 33, 56
See application file for complete search history.

(56) References Cited

U.S. PATENT DOCUMENTS 4,130,084 A * 12/1978 Hoelen ........................ 118/404
(Continued)

FOREIGN PATENT DOCUMENTS

DE 2 021 444 A1 2/1971
(Continued)

OTHER PUBLICATIONS

Leenders et al., "Method of Making a Flexographic Printing Sleeve Forme", U.S. Appl. No. 12/675,993, filed Mar. 2, 2010.

(Continued)

*Primary Examiner* — Dah-Wei Yuan
*Assistant Examiner* — Binu Thomas
(74) *Attorney, Agent, or Firm* — Keating & Bennett, LLP

(57) ABSTRACT

A coating device for coating a peripheral surface of a sleeve body with a coating formulation includes a vertical support column for supporting a sleeve body in a vertical position coaxial with a coating axis, a carriage slideable along the vertical support column, and an annular coating stage attached to the carriage and moveable therewith for containing the coating formulation and for coating a layer of the coating formulation onto the peripheral surface of the sleeve body during a sliding movement of the carriage along the vertical support column. The coating device includes an irradiation stage that is arranged to be moveable with the annular coating stage and to provide radiation to at least partially cure the layer of coating formulation onto the peripheral surface so as to prevent flow off of the coating formulation.

17 Claims, 5 Drawing Sheets

U.S. PATENT DOCUMENTS

| | | | | |
|---|---|---|---|---|
| 4,744,329 | A * | 5/1988 | Jeanmonod | 118/620 |
| 5,019,417 | A | 5/1991 | Northcutt | |
| 7,399,982 | B2 * | 7/2008 | Siegel | 427/492 |
| 2006/0207454 | A1 | 9/2006 | Goto | |

FOREIGN PATENT DOCUMENTS

| | | | |
|---|---|---|---|
| EP | 0744221 | A2 * | 11/1996 |
| EP | 1 004 362 | A1 | 5/2000 |
| FR | 2 583 150 | A1 | 12/1986 |
| GB | 1 029 822 | A | 5/1966 |
| JP | 55-106567 | A | 8/1980 |
| JP | 60-95546 | A | 5/1985 |
| JP | 2003-241397 | A | 8/2003 |
| WO | 2006/077732 | A1 | 7/2006 |

OTHER PUBLICATIONS

Vanmaele et al., "Method and Device for Coating a Peripheral Surface of a Sleeve Core", U.S. Appl. No. 13/002,656, filed Jan. 5, 2011.

Official Communication issued in International Patent Application No. PCT/EP2007/059807, mailed on Jun. 12, 2008.

* cited by examiner

DEVICE FOR COATING A PERIPHERAL SURFACE OF A SLEEVE BODY

CROSS-REFERENCE TO RELATED APPLICATIONS

This application is a 371 National Stage Application of PCT/EP2007/059807, filed Sep. 18, 2007. This application claims the benefit of U.S. Provisional Application No. 60/846,924, filed Sep. 25, 2006, which is incorporated by reference herein in its entirety. In addition, this application claims the benefit of European Application No. 06120823.7, filed Sep. 18, 2006, which is also incorporated by reference herein in its entirety.

BACKGROUND OF THE INVENTION

1. Field of the Invention

The present invention relates to an apparatus and a method for coating a sleeve body with a single or a multitude of uniform layers of a coating formulation.

More specifically the invention is related to a coating device and method of coating wherein an irradiation stage is moveable with a coating stage. The irradiation stage at least partially cures the coated layer applied by the coating stage.

2. Description of the Related Art

Flexography is today one of the most important processes for printing. It is a method that is commonly used for high-volume runs. Flexography is employed for printing on a variety of substrates such as paper, paperboard stock, corrugated board, films, foils and laminates. Packaging foils and grocery bags are prominent examples. Coarse surfaces and stretch films can be economically printed only be means of flexography, which indeed makes it very appropriate for packaging material printing.

It uses a rubber printing plate or a flexible photopolymer plate that carries the printing image in relief. The ink delivery system for flexography is achieved via an "anilox" engraved transfer roll.

Analogue flexographic printing plates are prepared from printing plate precursors that include a photosensitive layer on a support or substrate. The photosensitive layer includes ethylenically unsaturated monomers or oligomers, a photoinitiator and an elastomeric binder. The support preferably is a polymeric foil such as PET or a thin metallic plate. Imagewise crosslinking of the photosensitive layer by exposure to ultraviolet and/or visible radiation provides a negative working printing plate precursor which after development with a suitable developer (aqueous, solvent or heat development) leaves a printing relief, that can be used for flexographic printing.

Imaging of the photosensitive layer of the printing plate precursor with ultraviolet and/or visible radiation is typically carried out through a mask, which has clear and opaque regions. Crosslinking takes place in the regions of the photosensitive layer under the clear regions of the mask but does not occur in the regions of the photosensitive layer under the opaque regions of the mask. The mask is usually a photographic negative of the desired printed image. Flexographic printing plate making according to the above described process has the disadvantage that the production of a mask is time consuming and that the dimensional stability of these masks with changing environmental temperature or humidity is unsatisfactory for high quality printing and color registration. Moreover, the use of separate masks in flexographic printing plate production means additional consumables and chemistry, with a negative impact on economy and ecology aspects of the production process, which are far more a concern than the additional time required to make the masks. As a matter of fact, in most cases plate exposure and plate development may turn out to be more time consuming than mask making.

Direct digital imaging using laser recording of printing plate precursors, which eliminates the making of a separate film mask, is becoming increasingly important in the printing industry. The flexographic plate is made laser-sensitive by providing e.g. a thin opaque IR-sensitive layer to the photopolymerizable layer of the flexographic plate. Such a plate is sometimes called a "digital" flexo plate. The thickness of such IR-ablative layers is usually just a few μm. The IR-ablative layer is inscribed imagewise using an IR laser, i.e. the parts in which the laser beam is incident on are ablated, i.e. removed. The actual printing relief is produced in the conventional manner: exposure is effected with actinic light (UV, visible) through the mask produced, being imagewise opaque to the crosslinking inducing light, and the relief layer is thus selectively crosslinked. Development can be effected with an organic solvent, water or heat removing the photosensitive material from the unexposed parts of the relief-forming layer and the residues of the IR-ablative layer, either one by one using different developing steps or simultaneously using one developing step.

This method still requires a developing step as in the case of previous methods and hence the improvement in efficiency for producing flexo printing plates is limited.

In the direct laser engraving technique for the production of flexographic printing plates, a relief suitable for printing is engraved directly into a layer suitable for this purpose. By the action of laser radiation, layer components or their degradation products are removed in the form of hot gases, vapors, fumes, droplets or small particles and nonprinting indentations are thus produced. Engraving of rubber printing cylinders by means of lasers has been known since the late 60s of the last century. However, this technique has acquired broader commercial interest only in recent years with the advent of improved laser systems. The improvements in the laser systems include better focusing ability of the laser beam, higher power, multiple laser beam or laser source combinations and computer-controlled beam guidance. The actual engraving system includes efficient gas- and debris collecting systems. Direct laser engraving has several advantages over the conventional production of flexographic printing plates. A number of time-consuming process steps, such as the creation of a photographic negative mask or development and drying of the printing plate, can be dispensed with. Furthermore, the sidewall shape of the individual relief elements can be individually designed in the laser engraving technique.

Although photopolymeric printing elements are typically used in "flat" sheet form, there are particular applications and advantages to using printing elements in a continuous cylindrical form as a rubber or a polymer sleeve. Continuous printing forms provide improved registration accuracy and lower change-over-time on press. Furthermore, such continuous printing forms may be well-suited for mounting on laser exposure equipment, where it can replace the drum, or be mounted on the drum for exposure by a laser. Continuous printing forms have applications in the flexographic printing of continuous designs such as in wallpaper, decoration, gift wrapping paper and packaging.

Sleeves are made by coating, mold casting of an elastomeric layer onto a plastic or metallic cylinder, or winding a rubber ribbon around a plastic or metallic cylinder followed by a vulcanizing, grinding and polishing step. The forms preferable are seamless forms. As an alternative the elastomeric layer may be first applied on a flat support, which is then bent onto the carrier and bonded (cfr. NYLOFLEX® Infinity Technology from BASF).

At the print media fair DRUPA held in 2004 in Germany, Asahi Kasei showed a prototype of the Adless digital engraving technology for the production of endless photopolymer sleeves for digital engraving. It allows a liquid photopolymer material to be continually coated onto a sleeve/cylinder in a short time. The working principles of the technology are disclosed in published patent application JP 2003-241397 from Asai Kasei. The Adless system is based on a horizontal coating stage for applying a photopolymer coating onto a sleeve core. The gap between the sleeve core's peripheral surface and the coating stage is gradually increased, while rotating the sleeve core, to increase the thickness of the applied photopolymer coating layer. After coating, the coated material is cured through photo-polymerization or photo-crosslinking. A post-curing step of grinding and polishing the cured photopolymer layer is required to provide the necessary surface characteristics, such as evenness, to the photopolymer layer in order to make the sleeve suitable as a flexographic printing sleeve. The post-curing step is required a.o. because of photopolymer unevenness of the coating process and the presence of a polymer bulge at the location where the coating stage was withdrawn from the sleeve when stopping the coating process. The required grinding and polishing is a disadvantage of the Adless system. The large floor space required, seen the horizontal position of the coating system, is also a disadvantage.

Patent application publication JP 55-106567 from Canon discloses a vertical coating method and device for uniformly coating a setting paint onto a drum, fixing the paint onto the drum by providing a low-hardening energy and further hardening the fixed paint onto the drum by providing a high-hardening energy. The coating vessel and the equipment for providing the low- and high-hardening energy are fixedly mounted. The drum that is to be coated is attached to a lifting and lowering mechanism for firstly vertically immersing the drum into the coating vessel and subsequently lifting the drum out of the vessel and transporting the drum past an annular low-hardening energy device and then positioning the drum in front of a vertical high-hardening energy device. The disclosed coating device is suitable for the coating of drums limited in size (both length and diameter) because: (1) the length of the drum is limited to less than half the height of the equipment and less than the height of the vertical high-hardening energy device, and (2) the diameter of the drum is limited by the dimensions of coating vessel and the diameter of the annular low-hardening energy device.

U.S. Pat. No. 4,130,084 assigned to Stork Brabant B. V. discloses a vertical ring coater having an annular receptical containing a coating liquid and arranged coaxial with a vertically positioned thin walled perforated sleeve. A layer of coating liquid is applied on the periphery of the sleeve during vertical movement of the annular receptical along the vertically positioned sleeve. The layer of coating liquid is dried via heat energy provided via mounting flanges into the central part of the sleeve.

A need exists for a coating device with limited floor space requirements, suitable for making flexographic printing sleeves for direct laser engraving, without the need for grinding and polishing, that offers more flexibility towards types and sizes of sleeves and further reduces the access time and production cost of direct laser engraveable sleeves.

SUMMARY OF THE INVENTION

In order to overcome the problems described above, preferred embodiments of the present invention provide a coating device that supports a wide range of sleeve types and sizes, and is capable of coating a single or a multitude of "uniform" layers of direct laser engraveable material. The term "uniform" can refer to surface properties, evenness, smoothness, homogeneity, coating formulation, etc. of the layer(s). A preferred embodiment provides a coating device with limited floor space requirements.

Preferred embodiments of the present invention provide a coating device having the specific features set out below and a method for coating as specified below. With this arrangement, large size sleeves can be coated with acceptable-size equipment and the uniformity of the coated layer is provided through partial curing of the layer immediately after coating so as to preserve coating layer thickness, surface evenness, surface homogeneity and surface topology.

Further advantageous embodiments of the invention are set out in the description below.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS DEFINITIONS & INDUSTRIAL APPLICABILITY

The present invention related to a coating device and method for coating one or more uniform layers of photosensitive material onto a sleeve body, with a coating layer thickness variable between a few micrometers and some millimeters. Because one application for the present invention is the coating of an UV-curable material onto a sleeve core, the discussion below will often refer to sleeves, UV-curable coating formulations, UV-LED's, etc. to illustrate the invention. However, it should be understood that the present invention is not limited to UV light or UV photocuring technologies. The invention can for example be used for coating of formulations that solidify through thermal polymerization, an example of which is provided in WO 2005/084959 to Creo Ill. In general, the invention may be used with any curable formulation such as an e-beam curable formulation, IR or heat curable or hardening coating formulation for coating onto for example xerographic photoconductor drums or other cylindrical objects needing a protective or functional surface coating, a visible light curable formulation or a microwave curable formulation.

Figure 1:
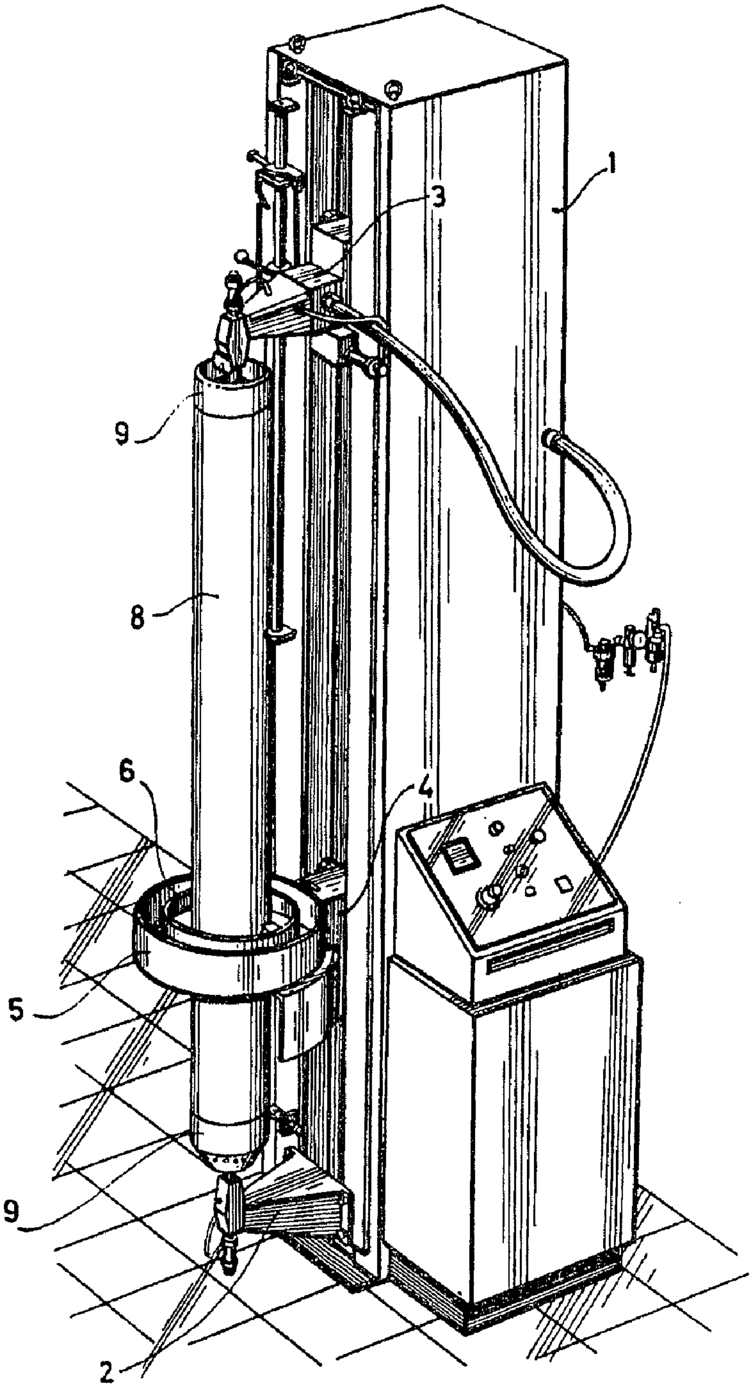
FIG. 1 PRIOR ART
FIG. 1 shows a vertical ring coater known from the prior art.

The invention may be engrafted on any equipment suitable for positioning a sleeve core in a vertical position and having a tool smoothly moveable along the sleeve core in the vertical direction. Examples of such equipment are vertical ring coaters described in the prior art or commercially available from Max Daetwyler Corporation (Switzerland), the Stork Prints Group (The Netherlands), and others. The description of the present invention will therefore not elaborate on the basic features of this type of equipment. Only in summary, a vertical ring coater as shown in FIG. 1 may include a vertical support column 1 that supports the sleeve core 8 in a vertical position, incorporates a mechanism 4 for lifting and lowering a coating carriage 5 vertically along the sleeve core 8, and provides a space envelope for integrating a number of utilities such as power cabling etc. The coating carriage 5 supports a coating collar 6 that is filled with a coating formulation for coating onto the sleeve core 8. The sleeve core 8 is mounted in the vertical position by means of flanges or mounting heads 9 at both ends; the flanges or mounting heads 9 themselves are supported on the vertical support column 1. The flanges or mounting heads 9 may be shaped so as to provide a smooth extension of the sleeve core's peripheral surface, thereby allowing coating of the sleeve core 8 up to edges, and to provide a sealed home position for the annular coating collar 6 at one of the flanges or mounting heads 9. The sleeve core 8 may be coated during an upward or downward movement of the coating collar 6.

When the coating collar 6 moves downward during the coating process, the coating layer is created from the meniscus between the surface of the coating formulation contained in the coating collar 6, and the peripheral surface of the sleeve core 8. In general, the thickness of the coating layer applied with this type of immersion coating technique is determined by the formula $$d = 20 * \sqrt{\frac{\eta * v}{f}} \quad \text{(Eq. 1)}$$

wherein d equals the thickness of the coated layer in μm, η is the viscosity of the coating formulation in mPa·s, v is the coating velocity in $m \cdot min^{-1}$, and f is the specific density in kg/liter.

In the further description of the invention terms like deep cure, surface cure, partial cure and full cure of a coated layer will be often used. In this disclosure "deep cure" refers to the curing of the bulk/body/mass of curable material in the coated layer whereas "surface cure" refers to the curing of the surface of the coated layer. Although a deep cure of a coated layer may also affect the surface of that coated layer, in that also the surface is cured to some extent, the focus is not on curing the surface of the coated layer but the bulk. With a surface cure, the focus is very much on curing the surface of the coated layer and providing a skin on the coated layer. The terms "partial cure" and "full cure" refer to the degree of curing, i.e. the percentage of converted functional groups, and may be determined by for example RT-FTIR (Real-Time Fourier Transform Infra-Red Spectroscopy)—a method well know to the one skilled in the art of curable formulations. A partial cure is defined as a degree of curing wherein at least 5%, preferably 10%, of the functional groups in the coated formulation is converted. A full cure is defined as a degree of curing wherein the increase in the percentage of converted functional groups, with increased exposure to radiation (time and/or dose), is negligible. A full cure corresponds with a conversion percentage that is within 10%, preferably 5%, from the maximum conversion percentage defined by the horizontal asymptote in the RT-FTIR graph (percentage conversion versus curing energy or curing time).

Annular Irradiation Stage

Figure 2:
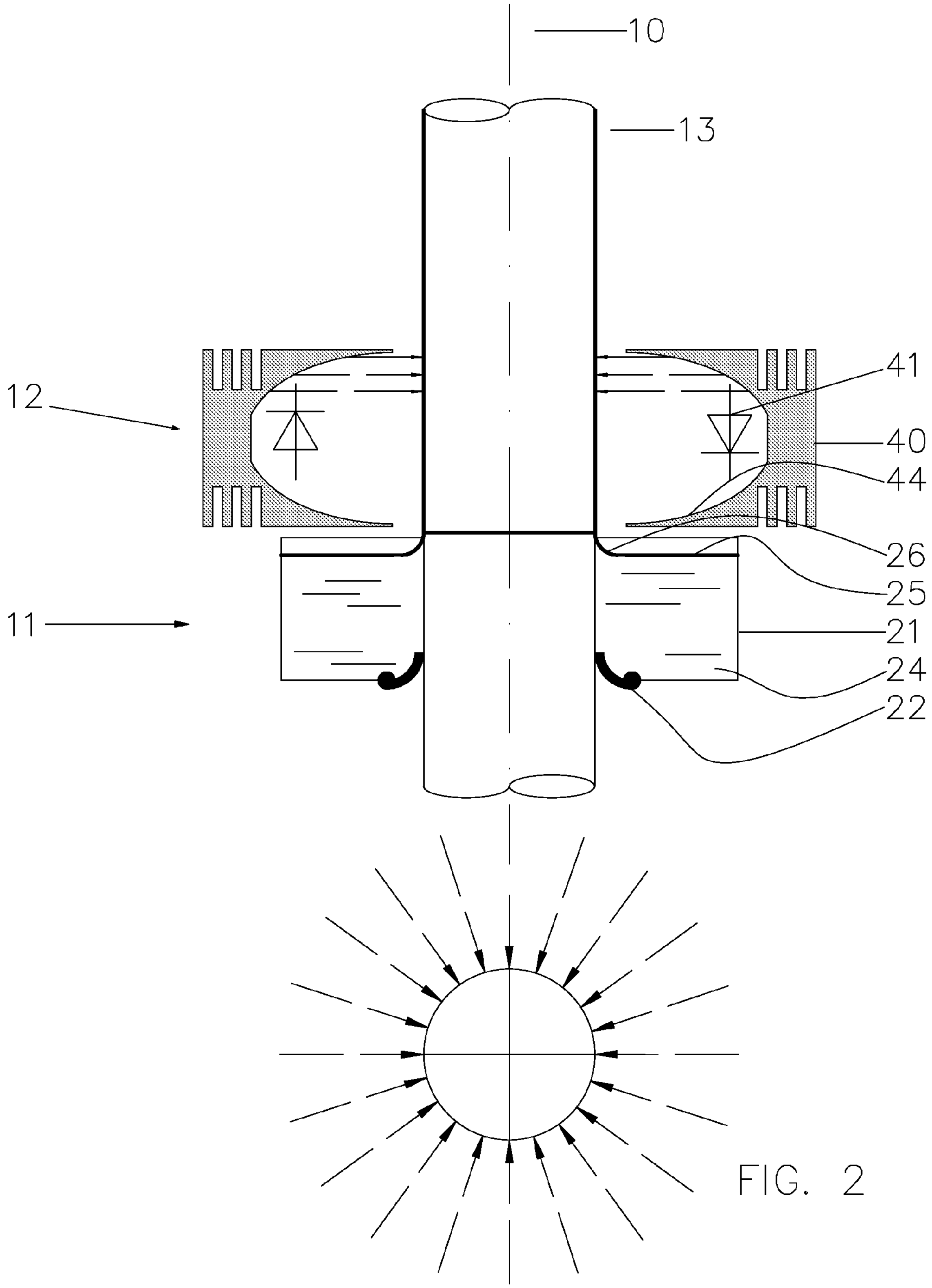
FIG. 2 shows a preferred embodiment of the present invention incorporating an annular irradiation stage.

A preferred embodiment of the invention is now described in detail, with reference to FIG. 2. The coating collar 21 in FIG. 2 includes an annular squeegee 22 providing a slideable seal between the bottom of the coating collar 21 and the sleeve core 13, in order to prevent a coating formulation 24 contained in the coating collar 21 to leak from the coating collar 21. The coating collar 21 may be open at the top. The surface 25 of the coating formulation 24 contained in the coating collar 21 forms an annular meniscus 26 with the peripheral surface of the sleeve 13. The coating collar 21 may be supported by a coating carriage (e.g. coating carriage 5 in FIG. 1) that is connected to a lifting and lowering mechanism (e.g. lift mechanism 4 in FIG. 1) incorporated in a vertical support column (e.g. column 1 in FIG. 1). These features have been omitted in FIG. 2. The lifting and lowering mechanism can move the entire coating stage 11, i.e. the assembly of the coating carriage with the coating collar, up and down along a vertical axis. When a sleeve 13 is mounted, the lifting and lowering mechanism is capable of moving the annular coating stage 11 along the peripheral surface of the sleeve 13, providing a coating meniscus 26 at the top and a sealing contact at the bottom of the coating collar 21. The coating axis 10 refers to the vertical axis through the center of the coating collar 21 and coincides with the axis of the sleeve 13 when mounted on the coating device. The coating collar 21 moves up and down, centered round the coating axis 10.

On top of the annular coating stage 11, an annular irradiation stage 12 is mounted. The purpose of the irradiation stage 12 is to sufficiently set the coated layer, just applied by the annular coating collar 21 during its vertical movement down the coating axis 10, so as to prevent the coating formulation from running down. Running down of the coated layer decreases the layer thickness at upper locations and increases the layer thickness at lower locations along the sleeve 13, and decreases the topographic uniformity of the layer and therefore the quality of the applied coating. It is therefore an advantage to "pin" the coated layer right after application onto the sleeve 13. The term "pin" does not necessarily imply a full setting of the coated layer; a partial setting of the layer to prevent run-down of the coating formulation from the sleeve 13 is sufficient to provide a uniform layer of coating material.

Figure 3:
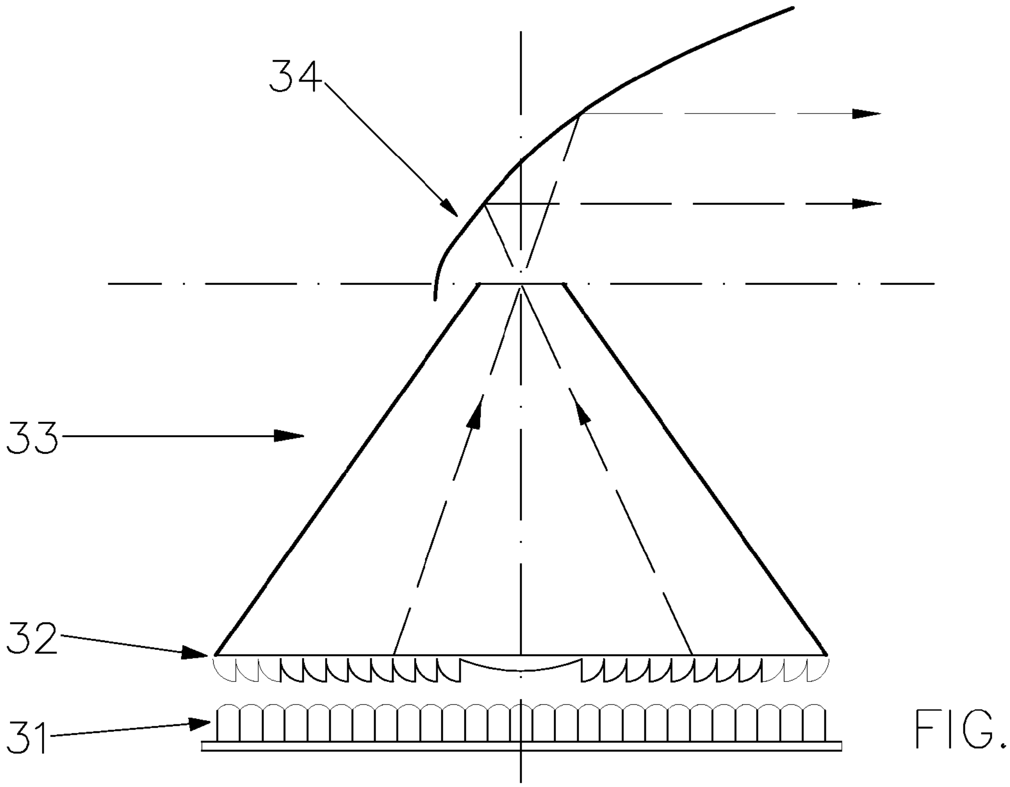
FIG. 3 shows a cross-sectional view of a preferred embodiment of an annular irradiation stage.
Figure 4:
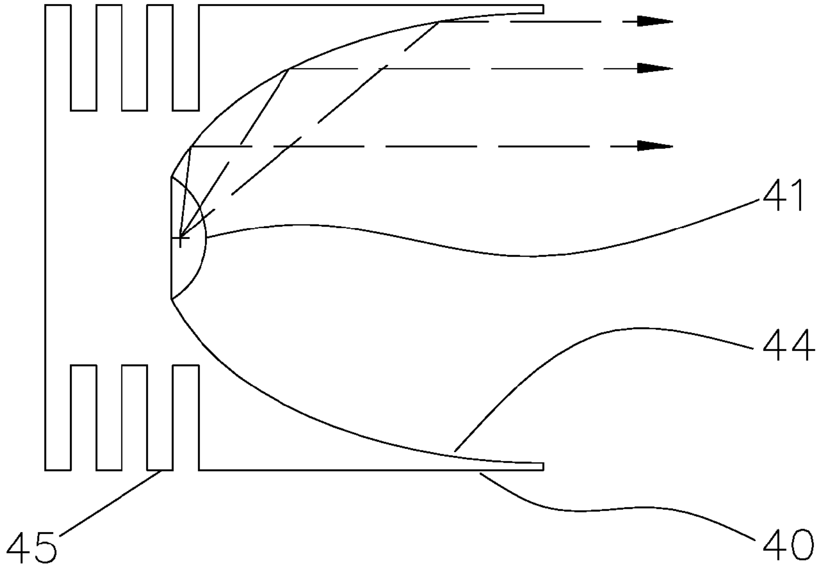
FIG. 4 shows a cross-sectional view of another preferred embodiment of an annular irradiation stage.

In a preferred embodiment, the irradiation stage 12 may be 360° all round and use UV LEDs combined with concentrating or collimating optics. UV LED's have several advantages compared to UV arc lamps, such as their compactness, acceptable wavelength and beam stability, good dose uniformity and a large linear control range of the output energy dose. A disadvantage of UV LED's is their relative low power output. UV LEDs however are relatively small and can be grouped together in such a way that their combined power is sufficient to cover the required range of UV curing doses for different types of coating formulations, different thicknesses of coating layer, different sleeve diameters and therefore different distances from the UV LED to the peripheral surface of the sleeve, etc. A cross-sectional view of a first embodiment of an annular irradiation stage is shown in FIG. 3. The irradiation stage is construed around an array of LEDs 31, a Fresnel lens 32 with reflector 33 and collimating mirror 34. The role of the optics is twofold: firstly Fresnel lens 32 with reflector 33 concentrates the light from the array of LEDs 31 into the focal point of the collimating mirror 34, and secondly the collimating mirror 34 collimates the light from the array of LEDs 31 into parallel horizontal beams for irradiating the coated layer on the sleeve. Revolving this optical setup 360° round the coating axis provides radiation from an annular radiation source, i.e. an annular LED array, that is substantially collimated in the horizontal direction and substantially focused onto the coating axis 10, as illustrated by the arrows in the lower part of FIG. 2. A cross-sectional view of a second embodiment of an annular irradiation stage is illustrated in FIG. 4 and shows a LED 41 positioned at the focal point of a parabolic reflecting cavity 44 of collimator base 40. A heat sink 45 for removing heat from the LED 41 is integrated in the collimator base 40. The small size of the LED 41 allows it to be positioned in the focal point of the parabolic reflecting cavity 44 without creating substantial voids in the collimated output beam. Revolving this optical setup 360° round the coating axis results in an annular radiation source and annular collimating optics for providing annular radiation as explained above.

The radiation energy contained in the collimated beam can be easily modulated, by adjusting the radiation intensity, so as to accommodate for the variation in distance or diameter of different sleeve cores, as well as for variations in the chemistry of the coating formulation.

The result is a radiation beam with large beam uniformity, high beam stability, wide range of beam intensity adjustment (LEDs can be dimmed to a few % of their maximal output power or can be time modulated), and precise control of the UV curing process through ease of calibration. The advantages are: (i) no extra mechanical adjustments needed when changing sleeve cores or sleeve core diameters and thus short sleeve change over time, (ii) adaptable irradiation power and thus no power loss, and (iii) uniform beam properties and thus accurate and uniform curing for excellent coating characteristics provided already at the coating stage (i.e. without post-treatment).

The annular shape of the UV LED array 41 and associated collimating optics 44 of the irradiation stage 12 allows a uniform annular irradiation of the coated layer. Furthermore, its compactness and low weight allow the annular irradiation stage 12 to be mounted on the annular coating stage 11. In operation, the annular irradiation stage 12 then moves along with the annular coating stage 11 and only one drive mechanism for moving the assembly up and down the sleeve core 13 is required.

Certain applications may require the use of a multitude of irradiation stages 12, mounted in cascade, for providing radiation with different wavelengths, for providing different radiation power, etc. at different heights from the coating stage 11. The multitude of irradiation stages may be mounted on top of each other as one assembly, which itself may be mounted onto the coating stage 11. Mechanically linking the stages together is not mandatory. It is however preferred that the stages be moveable up and down the sleeve core in a synchronized way.

Notwithstanding the movement of the coating stage 11 and possible disturbances of the surface 25 of the coating formulation 24 in the coating collar 21 during this movement, experiments show surprisingly that the coated layer, applied with a coating device as described above, is of a very good homogeneity and surface evenness.

Rotating Irradiation Stage

Figure 5:
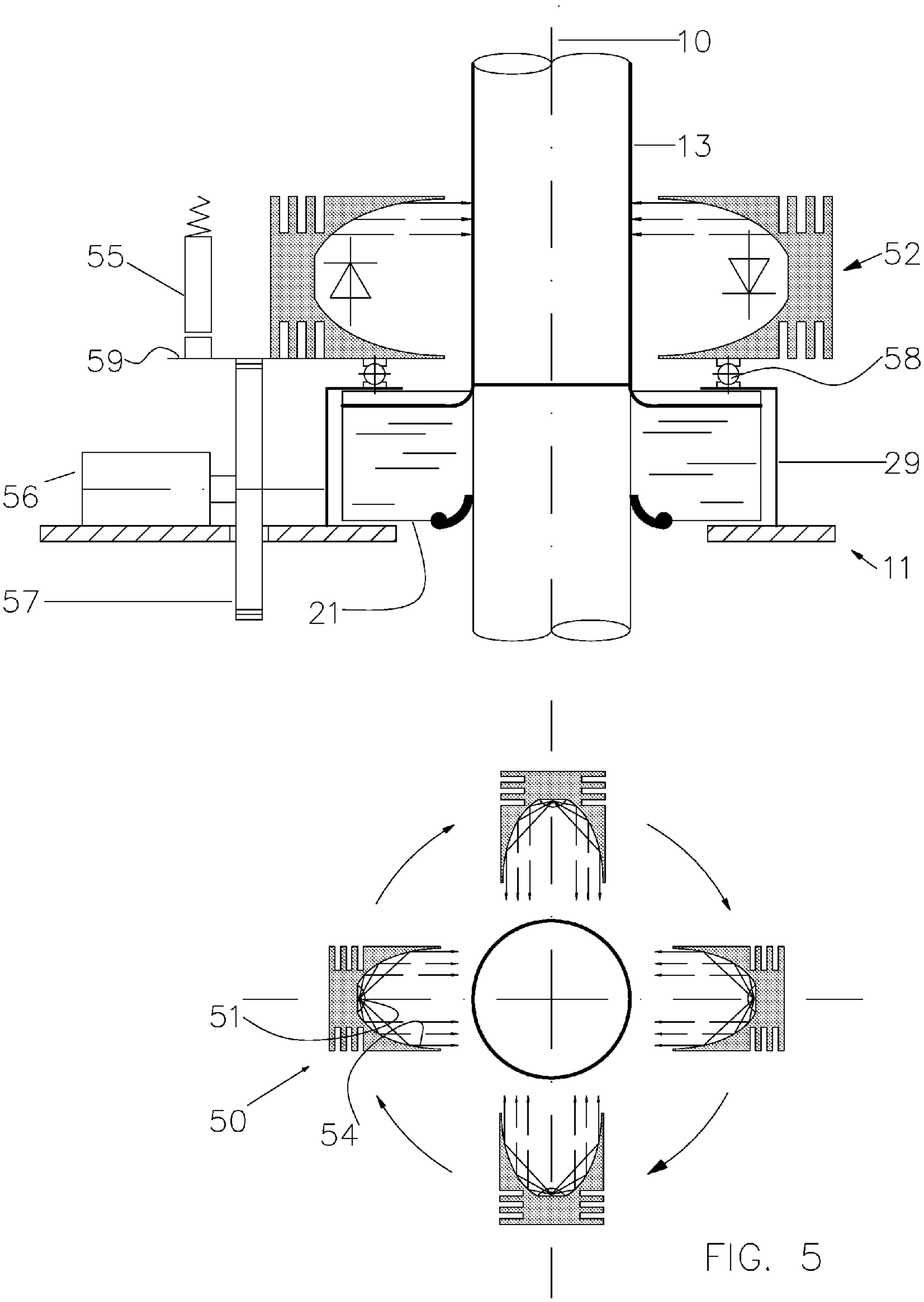
FIG. 5 shows a preferred embodiment of the present invention incorporating a spinning irradiation stage.

If however the irradiation stage is not all round annular, but includes one or more distinct circular irradiation sectors, one or more linear irradiation segments or singular irradiation units, the invention requires the irradiation stage to spin around the sleeve in order to achieve a uniform irradiation all round the coated layer. This is illustrated in FIG. 5. Four singular irradiation units 50 are shown equably arranged around the coating axis 10. Each irradiation unit 50 may include a UV LED 51 and collimating paraboloidal optics 54 to produce a beam of collimated parallel UV light. A detailed description of one embodiment of a singular irradiation unit 50 may be found in granted U.S. Pat. No. 6,880,954. The singular irradiation units 50 may be mounted on a mounting base 59 of the irradiation stage 52. In order to provide all round uniform irradiation of the coated layer on the periphery of a sleeve core 13, the mounting base 59 rotates around the coating axis 10 while coating is performed, i.e. while the coating stages 11 moves vertically coaxial with the coating axis 10. Therefore the mounting base 59 is mounted rotatable on the coating stage 11 by means of e.g. an annular guide 58, and driven by a motor 56 and gear transmission 57 mounted on the coating stage 11. The gear transmission 57 may include a gear wheel cooperating with a crown gear mounted on the mounting base 59, but other transmission systems may be used as well such as bevel gears. The mounting base 59 of the irradiation stage 52 further includes multiple rotational electrical connecting means 55, e.g. slip rings, for powering the multiple singular irradiation units 50 on the mounting base 59. Mechanical and electrical drive means and interconnections between the irradiation stage 52 and the coating stage 11 (e.g. the motor 56, the annular guide 58, the gear transmission 57 and the electrical slip connections 55) preferably refer to (or are mounted on) the coating carriage 29 of the coating stage 11. This setup allows exchangeability of the annular coating collar 21, to adapt for different external diameter of the sleeve cores to be coated, without changing the mechanical and electrical setup of the coating stage 11 and the rotatable irradiation stage 52. The illustrative embodiment of the rotatable irradiation stage 52 of FIG. 5 uses singular irradiation units 50. As indicated above the rotatable irradiation stage may include other irradiation units such as irradiation segments based on an array of LEDs and a concentrating and collimating mirror, or they may include arc lamp systems although these are generally more complex and heavier to mount, connect and rotate. The rotation of the irradiation stage provides a 360° integration of the radiation from the different irradiation units and smoothens the radiation intensity variations between different irradiation units and within each irradiation unit. An equable distribution of the irradiation units around the coating axis may be a preferred setup, but it is not required because the rotation of the irradiation stage will provide a 360° integration anyhow. A rotatable irradiation stage may therefore also be realized using only one singular irradiation unit.

Further Embodiment Details or Alternatives

Alternative Irradiation Stage

In the embodiments described above the irradiation source, e.g. an individual LED or an annular LED array, was linked to a corresponding collimating optics, e.g. a paraboloidal reflector respectively an annular collimating optics, and was considered as one assembly. In an alternative embodiment the optics may be omitted with the LED radiation source directly irradiating the peripheral surface of the coated sleeve. Rotation of the irradiation source may provide additional integration and averaging of the radiation energy. In another alternative embodiment a non-rotating annular collimating optics may be combined with a rotating radiation source. In this configuration, the radiation source orbits between the peripheral surface of the sleeve core and the annular collimating optics.

Radiation Lock

From Eq. 1 we know that the viscosity of the coating formulation is an important parameter in controlling the thickness of the applied layer. It is therefore preferable to shield the coating formulation in the coating collar from any sources that directly or indirectly may change the viscosity of the coating formulation. In radiation curable systems, exposure to radiation changes the viscosity of the coating formulation, i.e. the viscosity of a coating formulation increases when exposed to radiation in order to pin, set or cure the coated formulation. The coating device according to the invention therefore preferably includes a radiation lock positioned between the radiation stage and the coating stage, and moveable therewith, for shutting off direct and indirect, e.g. scattered, radiation coming from the radiation source from radiating the coating formulation contained in the coating collar. The radiation lock is preferably annular shaped and may for example be realized by providing a cover to the coating collar reservoir. A more advanced radiation lock would be an adjustable iris diaphragm as used in optics, the diaphragm opening being adjusted to be slightly larger than the diameter of the sleeve to be coated. The annular radiation lock may be mechanically integrated in the coating stage, in the irradiation stage or as a separate unit in between both stages.

Another process parameter influencing the viscosity of the coating formulation contained in the coating collar may be the temperature of the coating formulation. In a preferred embodiment, the coating formulation contained in the coating collar or the coating collar itself may therefore be thermostatically controlled.

Inert Environment

In applications using free radical UV curable formulations, it is known that the curing, in some cases, may be retarded or even not initiated due to the presence of oxygen in the cure zone. In this case, an inert atmosphere may be used to enhance the cure capabilities. In relation to UV curing, the term 'inert' simply means the elimination (in ideal situations) or the minimizing (in more realistic situations) of the amount of inhibiting oxygen at the surface of the coated layer within the UV cure zone. In a vertical coating device according to the invention, the cure zone refers to the space between the surface of the coated layer and the irradiation stage. An inert environment may be created by (i) adding a gas such as nitrogen, argon or carbon dioxide to the atmosphere in the cure zone and especially close to or at the surface of the coated layer, and (ii) minimizing the ingress of air, as a result of the drag effect resulting from the relative movement between the non-moving coated layer and the moving irradiation stage, in the cure zone.

Adding an inert gas, such as nitrogen, argon or carbon dioxide, to the atmosphere in the cure zone may be realized by use of an annular manifold, moving together or integrated with the irradiation stage and connected with flexible tubing to a source of inert gas housed in the vertical support column of the coating device. Annular clearance seals at both ends of the cure zone, i.e. at the upper and lower end of the irradiation stage, having a small clearance to the peripheral surface of the coated sleeve may be used to prevent the inert gas from flowing out of the cure zone. These seals preferably have an adjustable inner diameter to fit with a small clearance to the various sleeve diameters. Iris diaphragms may be suitable seals for this purpose. A controlled flow of inert gas within the cure zone may be realized with two manifolds, i.e. an inlet and outlet manifold.

The ingress of air in the cure zone is likely to occur at the lower end of the cure zone, when the coating stage moves downward during the coating process. That is, the air is likely to enter from between the coating stage and the irradiation stage. Counteracting this air intake may be accomplished by means of an annular blow knife positioned at the lower entrance of the curing zone, i.e. between the irradiation stage and the coating stage. The annular blow knife, moving with and between the coating stage and the irradiation stage, may be connected with flexible tubing to a source of inert gas housed in the vertical support column of the coating device, for blowing inert gas and blocking the air intake.

The above "closed" inert environment has been described in relation to oxygen inhibition in free radical UV curing systems. Depending on the coating formulation and the way the coated formulation is cured, other embodiments of an inert environment may be thought of.

Instead of providing and integrating a series of supplementary tools in and around the moveable irradiation stage to create an local inert environment in the cure zone, the entire coating device may be capped and closed off from ambient environment, in which case the task of creating an inert environment in the cure zone is much simpler, i.e. the inert environment is created within the closed cap. Alternatively, the entire coating device may be installed in an inert environment or room provided by the end user.

Full-Cure Irradiation

As described before, the radiation from the irradiation stage is targeted at least partially curing the coated layer so as to prevent run-down of coating formulation from the sleeve and thus fixing the coating layer thickness. The initial curing dose, applied immediately after coating, often provides insufficient energy to fully cure the coated layer. A full cure of the coated layer may be provided off-line using existing sleeve processing devices or may be provided in-line using an additional radiation system as disclosed in Japanese patent application JP 54-014630.

An alternative to the irradiation system disclosed in JP 54-014630 is a robotic arm including two shells of a vertical full cure irradiation tunnel, much like the two halves of a sun tube solarium. The irradiation tunnel may be mounted and supported by the existing vertical support column of the coating device or may have its one mounting column. A dedicated mounting column for the vertical irradiation tunnel may for example be positioned opposite the vertical support column of the coating device, with respect to the coating axis, and therefore interfere as little as possible with the operation of the coating process. The two shells of the full-cure irradiation tunnel, when closed, preferably are designed to substantially completely surround the sleeve along the full length (height) and provide an all round radiation to fully cure the coated layer on the sleeve. A full cure is typically performed when the coating stage and the irradiation stage are positioned at one of the flanges or mounting heads so as to leave the surface of the coated sleeve completely accessible to the vertical irradiation tunnel. After full curing the coated layer on the sleeve, the vertical full-cure irradiation tunnel may be opened to release the sleeve for either removal from the vertical coating device or for application of a next layer of coating formulation (see further). Opening and closing the vertical tunnel may be performed by an operator or may be automated via actuators (e.g. controllable spring hinges) in the vertical support column in the way two co-operating robotic arms would be controlled. The vertical irradiation tunnel may be equipped with radiation sources different from the type used in the irradiation stage that moves along with the coating stage to partially cure to applied layer of coating formulation. As the target of a partial curing is to prevent run-down of coating material from the sleeve, the irradiation stage preferably includes a radiation source for deep curing the coated layer. In the case of UV-curable formulations, this preferably is a UVA radiation source irradiating wavelengths between about 320 nm and 400 nm. As a full cure is targeted at further curing the formulation coated on the sleeve, up to about the maximum conversion percentage of functional groups in the formulation, the vertical irradiation tunnel preferably includes radiation sources for deep curing and optionally surface curing of the coated layer. In the case of UV-curable formulations, this preferably is a UVA radiation source (for deep cure) and optionally a UVC source irradiating wavelengths below 280 nm (for surface cure). If UV arc lamps are used instead of UV-LEDs, a single lamp may irradiate at a range of wavelengths, possibly including UVC (below about 280 nm), UVB (between about 280 nm and 320 nm), UVA (about 320 nm and 400 nm) and UV-Visible light (above about 400 nm). Multiple irradiation sources, each with a different or overlapping narrow irradiation spectrum, may also be combined in the vertical irradiation tunnel to provide a wide spectrum of UV radiation for full curing the coated layer.

A full cure of the coated layer may also be realized in-line by adding radiation capacity to the existing irradiation stage. The additional capacity may be realized by increasing the available radiation power (e.g. additional UV LED arrays), adding a different type radiation (e.g. adding surface cure UVC wavelength radiation to existing deep cure UVA radiation), using specially adapted collimating optics for delivering a variable irradiation intensity as a function of the vertical distance from the coating meniscus (e.g. collimating optics for providing high irradiation intensity close to the coating meniscus, to realize an short but intense deep cure of the coated layer, and a vertically spread out lower irradiation intensity further away from the coating meniscus, to realize further deep and surface curing of the coated layer), or by straightforward duplicating existing irradiations stages.

As described before, mechanically linking the irradiation stage with the coating stage is not mandatory but movement of both stages in a synchronized way so as to maintain a constant time delay between coating of the layer of coating formulation and partial curing of the coated layer is preferable. In a further embodiment of the invention, it may be preferable, after the layer of coating formulation has been applied and partially cured, to physically and/or control-wise disconnect the irradiation stage from the coating stage and provide for the irradiation stage to move up and down the coated sleeve as an independent unit, as often as required, to further cure (possibly full cure) the applied layer of coating formulation. Before a next layer of coating formulation is applied, the irradiation stage may again physically or control-wise be connected to the coating stage. Note that in the setup of an independent moving irradiation stage, the irradiation stage must be connected to an independent carriage for moving the irradiation stage up and down the sleeve independently from the coating stage. The coating stage may then be hooked onto the carriage of the irradiation stage and move as a slave unit with the irradiation stage (instead of vice versa as described in previous embodiments) or the coating stage may keep its independent carriage and move in a synchronized way with the irradiation stage.

Pre- or Post-Treatment

A vertical tunnel as described above may also be designed to apply a special surface treatment of the sleeve or the coated layer. A vertical tunnel may for example incorporate corona devices to enhance the adhesion of the coating formulation onto the surface of the sleeve body, or it may include UV irradiation sources with a radiation wavelength below 280 nm to reduce the tackiness of the final surface of the coated layer.

LED Technology

An advantage of using LED technology for irradiating the coated layer is that the radiation intensity, and therefore the amount of radiation energy received by the coated layer, is easily adjustable. In one example the radiation intensity may be adjusted as a function of the coated layer thickness or a corresponding process variable (see Eq. 1 above), e.g. the viscosity of the applied coating formulation or the coating speed. In another example the radiation intensity may be adjusted as a function of the coating formulation or a component in the coating formulation, e.g. the amount of photoinitiators or sensitizers included in the coating formulation. In still another example the radiation intensity may be adjusted as a function of the optical distance between the radiation source and the peripheral surface of the coated sleeve. For example, in FIG. 2 the received radiation energy per unit area of the coated layer decreases with increasing sleeve diameter. This variation may be calculated and compensated for by adjusting the radiation intensity or power of the LEDs so as to keep the radiation energy per unit area of the coated layer constant.

Compared to alternative radiation technologies such as for example arc lamp sources, LED technology provides the advantage of a small footprint and good beam and wavelength stability.

A further advantage of LED technology is their narrow bandwidth and singular spectral output, and the possible choice of a mixture of different spectral output UV LEDs. The choice of single wavelength UV output or a combination of spectral outputs allows for the further tuning of the UV curing process and the coating chemistry. A combination of spectral outputs can easily be realized by providing multiple banks of LEDs, each bank including LEDS with a different spectral output, and switching one or more banks ON or OFF in order to realize the spectral combination sought. Furthermore, the nearly complete absence of any IR radiation from these UV LEDs eliminates the need for IR-absorption filters, such as water-filled reservoirs, and is a bonus in reducing local and uneven subject heating.

Still further advantages of LED technology are its compactness, low weight and the ongoing technological trend towards higher power LEDs.

Laser Curing

Figure 6:
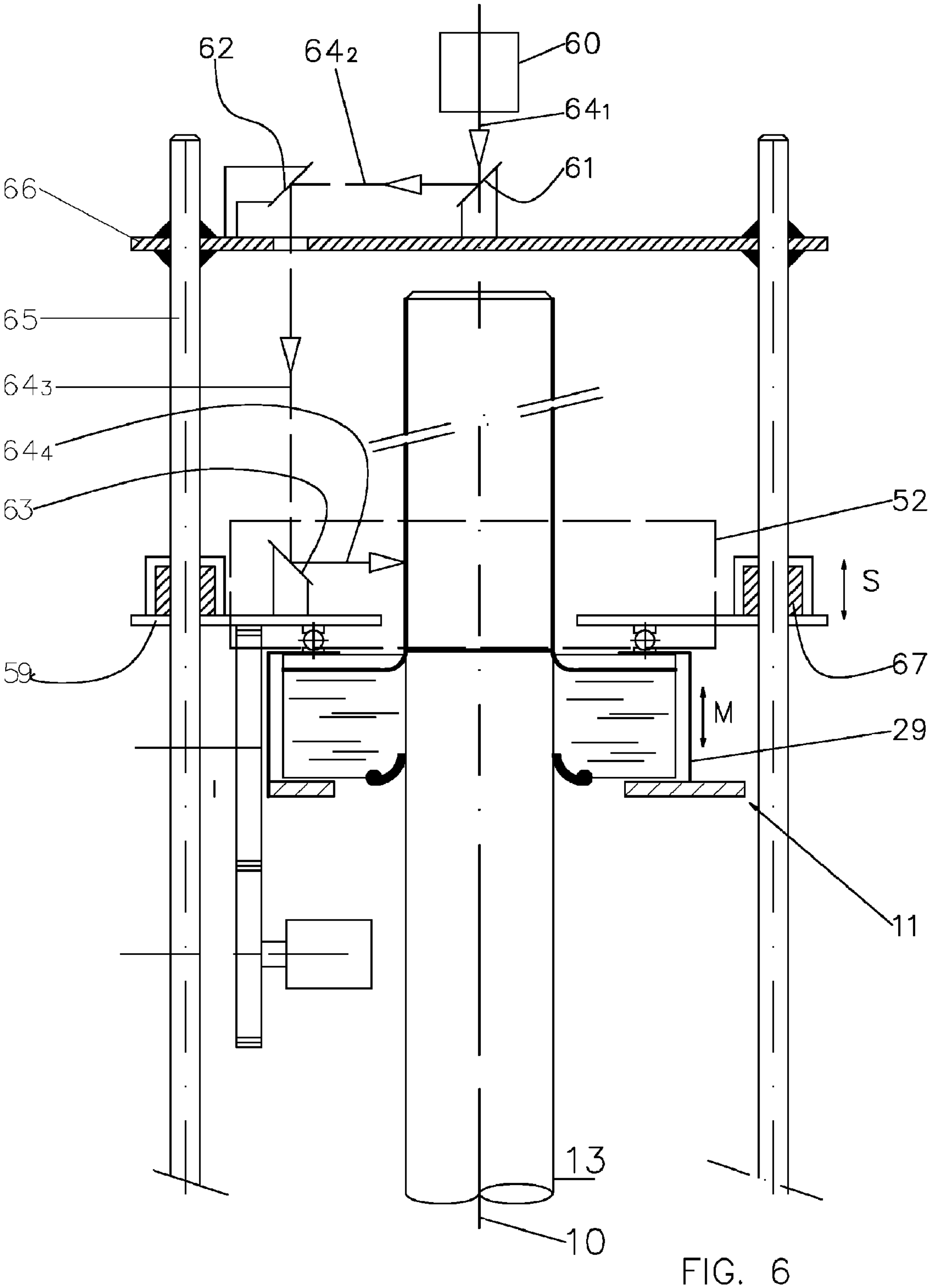
FIG. 6 shows a preferred embodiment of the present invention incorporating a spinning laser beam for irradiating the coated layer.

An alternative embodiment of a coating device according to the invention is shown in FIG. 6 and may include a rotating irradiation stage with a laser beam 64 as a rotating single irradiation unit. The laser beam 64 may be provided from a fixed laser source 60 above the sleeve core 13, possibly mounted onto the coating device's vertical support column (see FIG. 1). For that purpose, the sleeve is single-ended mounted via the bottom flange or mounting head of the coating device. The laser source 60 may be mounted coaxial with the coating axis 10 for creating a laser beam 64 starting off along the coating axis 10. A spinning optical path is provided for guiding the fixed laser beam starting off at the laser source 60 to a spinning mirror 63 used for directing the laser beam onto the peripheral surface of the sleeve 13. In the embodiment shown in FIG. 6, the spinning optical path is created via a rotating central mirror 61 deflecting the starting laser beam $\mathbf{64}_1$ in a direction perpendicular to the coating axis 10 and spinning the laser beam around the coating axis 10. A first spinning mirror 62, co-operating with the rotating central mirror 61, deflects the spinning laser beam $\mathbf{64}_2$ parallel with the coating axis but at the outside of the sleeve. Finally, a second spinning mirror 63 that is part of the rotating irradiation stage 52 co-operates with the first spinning mirror 62 and deflects the spinning laser beam $\mathbf{64}_3$ towards the coating axis 10 thereby projecting laser beam $\mathbf{64}_4$ in a spinning way onto the coated layer on the peripheral surface of the sleeve 13. The synchronization of the multiple co-operating mirrors 61-62-63 may be realized by fixing their angular position via a mechanical framework 65-66 attached to the mounting base 59 of the rotating irradiation stage 52. The framework 65-66 therefore spins along with the irradiation stage 52. The spinning of the laser beam 64 is therefore completely controlled by and synchronized with the rotation of the irradiation stage 52.

In a preferred embodiment, as shown in FIG. 6, a vertical guiding system 67 may be installed to keep the rotating framework element 66, and mounted thereon central mirror 61 and first spinning mirror 62, at a fixed vertical position independent of the vertical position of the coating stage 11 and irradiation stage 52 and the movement of these stages during a coating operation. The main advantage is to reduce the height for the coating device. This may be realized in two ways. If the vertical position, i.e. the height, of the rotating framework element 66 is mechanically fixed for example via a link to the coating device's vertical support column, a vertical guiding means 67 may include simple bearings to allow relative movement between the coating/irradiation stage and the framework element 66. Alternatively, if the vertical position, i.e. the height, of the rotating framework element 66 is not mechanically fixed, the vertical guiding system 67 preferably includes an active linear motion system (not shown) for controlling a relative movement between the coating/irradiation stage and the framework element 66 so as to keep the framework element 66 at a fixed vertical position independent of the vertical position of the coating/irradiation stage.

In another embodiment the rotating framework element 66 may be mounted completely independent from the coating/irradiation stage. The spinning framework elements 65 and vertical guiding system 67 may then be omitted and the rotation of the framework element 66 is then synchronized with the rotation of the irradiation stage and the framework element 66 in order to preserve the continuous spinning optical path that guides the laser beam 64 onto the peripheral surface of the sleeve 13. The coating device may then include two synchronized independent spinning entities.

In order to avoid collision of the spinning framework elements 65 with the mechanism for lifting and lowering the coating carriage, the lifting and lowering mechanism as illustrated in FIG. 1, integrated in the peripheral vertical support column, preferably is replaced by a linear motion system operating completely within the space envelope of the spinning framework element 65. Telescopic lift systems operating within this space envelope may for example be used.

The above disclosed embodiment of the invention is described with reference to a laser system. The inventive concept however is not limited thereto and in general includes the use of a fixed mounted radiation source linked to a spinning optical path to guide the radiation beam from the fixed radiation source round the peripheral surface of the sleeve, and in synchronism with the vertical movement of a coating stage. Any radiation source that provides the required type of radiation, with enough power to at least partially cure the coated layer on the peripheral surface of a sleeve, may be used.

Different Sleeve Sizes

It has been mentioned in a previous section that the radiation power may be adjusted as a function of the optical distance from the irradiation source to the peripheral surface of the sleeve, such that adequate curing (at least partial) or "freezing" of the coated layer onto the peripheral surface of the sleeve is achieved. This improves the compatibility of the irradiation stage with different sleeve diameters. Three alternative configurations are provided: (1) the irradiation stage configuration is fixed and designed to accommodate the largest sleeve diameter within a range of different sleeve diameters and the radiation power of the irradiation units is adjusted as a function of sleeve diameter used, (2) the irradiation stage configuration is adjustable and designed to adjust the radial position of the irradiation units to the diameter of the sleeve used and (3) the irradiation stage is adjustable and designed to adjust the spinning velocity of the irradiation units around the coating axis in order to keep the radiation energy received per unit area on the peripheral surface of sleeves of different sleeve diameters constant.

With respect to the coating stage, the coating meniscus and the annular seal are important issues when changing sleeve diameter. The annular seal around the peripheral surface of the sleeve prevents leakage and run down of coating formulation from the coating collar. When changing sleeve diameter, either the entire coating collar (including the annular seal) may be replaced by another coating collar suited for the new sleeve diameter or only the annular seal may be replaced or adjusted to fit with the new sleeve diameter. If the annular seal is realized as an iris diaphragm of which the aperture is adjustable within a range, no replacement parts are required when changing sleeve diameter, provided that the sleeve diameter falls within the range of the adjustable aperture. If the annular seal is removably attached to the coating collar, a seal with a different fixed internal diameter may be used.

Preferably the coating stage and the irradiation stage are designed to support the same range of sleeve diameters so that both modules can be pre-assembled as a tandem and treated as one assembly that can be easily replaced for operating with different ranges of sleeve diameters.

Drive Systems & Process Control

In the embodiments described above, the irradiation stage or multitude of irradiation stages are mounted on top of the coating stage and move together with the coating stage as a single "coating assembly". From a mechanical point of view, this provides the advantage that only one lifting and lowering mechanism is required to operate the vertical coating device, whereas from an electrical point of view, all electrical connections to the "coating assembly" may be provided through a single cable carrier between the stationary vertical support column and the moving "coating assembly".

An energy dose controlling system may be added to the "coating assembly" for measuring the effective curing rate of the applied layer and adjusting the applied energy dose, spinning velocity (if applicable) and/or coating speed in a closed loop system in order to obtained the desired coating layer thickness and uniformity. An infrared spectrometer, such as an FTIR, may for example be used to measure the degree of UV or EB curing, i.e. the curing rate, of the coated layer.

However, if the purpose of the irradiation stage is to only partially set the coated layer to prevent run-down of the coating formulation from the sleeve, the irradiation dose is less critical and monitoring of the irradiation dose in a closed loop system may not be required. A calibration of the irradiation stage combined with open loop control may be sufficient.

Operation

Preparation

The coating device according to the invention may be set up and prepared for coating operations without the presence of a sleeve core. Thereto, one of the flanges or mounting heads, for mounting the sleeve onto the coating device, may be used to provide a home position to the coating assembly (i.e. coating stage+irradiation stage). The flange or mounting head providing this home position has a similar or slightly smaller external diameter than the diameter of the sleeve cores intended to be used with the flange or mounting head. When the coating assembly is in its home position, the annular seal of the coating collar may be adjusted to fit with the sleeve core diameter, even prior to mounting the sleeve core in the coating device, and the coating collar may be filled with a coating formulation, without leakage. The coating stage is then ready for coating operations.

If flanges or mounting heads are used with substantially different external diameter than the diameter of the sleeve cores to be coated, the preparation of the coating assembly can not be performed without the presence of a sleeve core mounted on the coating device. A home position for the coating assembly should then be provided by the sleeve itself. This is however not a preferred situation as it requires additional care and setup of the coating collar with each change of sleeve core.

Immersion Coating

After preparing the coating assembly and mounting the sleeve core on the coating device, the lifting and lowering mechanism moves the coating assembly to a start position with the coating meniscus close to or just past an end of the sleeve core, depending on the type of flange or mounting head used. The coating process preferably starts at the upper end of the sleeve core and continues in a downward direction to the lower end of the sleeve core while the lifting and lowering mechanism moves the coating assembly downwards. In this setup, the coating process is equivalent to an immersion type coating process. As the coating assembly moves downward, the irradiation stage follows immediately after and irradiates the just coated layer to at least partially cure the coated layer, which prevents run down of the applied coating formulation. If a spinning irradiation stage is used, the irradiation stage not only follows the coating meniscus at a fixed distance, but in addition spins around the sleeve core to generate a uniform 360° irradiation of the coated layer. At the lower end of the sleeve core, the lifting and lowering mechanism halts the coating assembly with the coating meniscus close to or just past the lower end of the sleeve core, depending on the type of flange or mounting head used. If the flanges or mounting heads allow end-to-end coating of the sleeve core, the coating assembly will be moved that far downward to allow the irradiation stage to irradiate the coated layer up to the lower end of the sleeve core.

The thickness of the coated layer may be controlled via the velocity of the coating assembly moving downward, the viscosity of the coating formulation or the number of successive coating operations applied (see hereinafter). After the coating process, the irradiation stage may be physically or control-wise disconnected form the coating stage (if the setup of the coating device so allows) and be moved up and down the coated sleeve independent from the coating stage to further cure the coated layer. Depending on the thickness of the coated layer, the level of curing preferred and the type/amount of curing energy available from the irradiation stage, one or more cycles up and down the sleeve may be required. Alternatively, after the coating and irradiation stage have reached the lower flange or mounting head, the vertical irradiation tunnel may be used to further cure the coated layer while the coating and irradiation stage remain stationary at the lower flange or mounting head. After the coating process, the coating assembly is left at its position against the lower or upper flange or mounting head and the coated sleeve may be removed, without special care for the coating collar.

Squeegee Coating

Alternatively, a coating layer may be applied while the coating assembly moves upward, in which case the coating mechanism is a squeegee type coating mechanism, instead of the immersion type coating during the downward movement of the coating assembly as described above. Application of a coating layer during upward movement of the coating assembly, may require an irradiation stage positioned below the coating stage and moving together with the coating stage to at least partially cure the squeegee coated layer. Squeegee type coated layers, associated with an upward movement of the coating collar, may be substantially thinner than immersion type coated layers, associated with a downward movement of the coating collar. Unfortunately there is no formula, analogous to Eq. 1, known to the inventors to predict the thickness of the squeegee type coated layer. Each of the alternatives may therefore have advantages in specific applications.

Multiple Pass Coating

The coating device may also operate in a multiple pass mode with "intermediate" curing of each of the applied layers. The purpose of intermediate curing is to sufficiently set the coated layer in order to avoid deformation of this layer during a next coating step or during a sliding contact with the annular squeegee of the coating collar when the coating stage is moved. The intermediate cure preferably does not generate a full cure of the coated layer. More specifically it preferably generates enough curing in the bulk of the coated layer (to avoid deformation) but leaves the surface of the coated layer not fully cured (to maintain good adhesion properties of a next layer of the coating formulation onto the intermediate cured layer of the coating formulation). An intermediate cure step may be provided by the irradiation stage via additional up/down movements thereof (disconnected from the coating stage) or by an additional vertical irradiation tunnel, as described above.

A multiple pass operating mode may include the steps of applying a first immersion coated layer while moving a coating assembly downward and at least partially curing the first immersion coated layer with an upper irradiation stage positioned above and moving with the coating stage; optionally providing an intermediate curing step to further cure the coated layer and then moving the coating assembly upward again in sliding contact with the just previously coated layer; then applying a second immersion coated layer while moving the coating assembly downward and at least partially curing the second immersion coated layer with the upper irradiation stage moving with the coating stage and optionally providing an intermediate cure step, etc. As the annular squeegee of the coating collar is designed to prevent leakage of coating formulation from the coating collar, at the sliding contact between the coating collar and the sleeve, the thickness of the layer applied via a squeegee type coating during the upward movement of the coating assembly typically is significantly less than the thickness of the layer applied via immersion coating during the downward movement of the coating assembly. In the description of the multiple pass coating method above, the squeegee type coated layer is therefore disregarded because it only has a marginal contribution to the thickness of coated multilayer. Indeed, there is a main (immersion) coating action during the downward movement of the coating assembly and only a fractional (squeegee) coating action during the upward movement thereof. The coating is thus primarily unidirectional. Intermediate curing of the fractional (squeegee) coating layer may therefore not be necessary as it will merge with the significantly thicker subsequent main (immersion) coating layer from a subsequent coating action. The squeegee coated layer, merged with the immersion coated layer, is of course irradiated using the upper irradiation stage when the coating assembly is moved downward. So, a multiple pass coating device according to the invention not necessarily includes an upper and a lower irradiation stage to at least partially cure the coated layer in both coating directions; a single irradiation stage linked with a main coating direction may serve.

Multiple pass operation of the coating device as described may be used for applying uniform thick layers of a coating formulation onto sleeve cores. It may for example be used in cases where physico-chemical parameters of the coating formulation, e.g. viscosity, or limitations of the coating device, e.g. coating velocity, would limit the thickness of a coated layer as predicted from Eq. 1 to a value below what is functionally required for the application. Especially for flexographic sleeves or printing masters, the relief-forming layer may require a thickness of several millimeters, which is hard to achieve in a single pass coating process.

Multiple pass operation of the coating device may also be used for applying a multitude of layers of different coating formulations. The coating formulations may have different physicochemical properties, e.g. viscosity, or the corresponding coated layers may have different physicochemical or mechanical properties such as compressibility, hardness, wear-resistance, wettability, etc. E.g. for the production of flexographic sleeves, it may be desirable to have a compressible base (suitable for absorbing for example the unevenness in corrugated board printing material) and a hard surface or top layer (for increased durability and suitable for longer print runs). If desired a complete physicochemical thickness profile may be created for the coated multilayer. If multiple pass operation is used to apply multiple layers of different coating formulations, the coating collar may need to be drained and replenished with a different coating formulation. These actions may be performed when the coating stage is located at one of the flanges or mounting heads; the flanges or mounting heads provide a sealing home position or service position for the coating collar. These positions also allow for altering the squeegee internal diameter (e.g. by changing to a larger internal diameter as the total thickness of the coated multilayer increases) while the sleeve remains mounted in the coating device or even replace a complete coating collar if required. The home or service position of the coating collar can be either one of the upper or lower flange or mounting head.

Post-Processing

Single pass and multiple pass operation of the coating device may be concluded with a post-processing of the coated sleeve, e.g. a post-baking of the applied coating or a tackiness reducing treatment of the top layer, e.g. with UVC light. These steps may be provided on-line using for example the vertical irradiation tunnel described above, having the appropriate irradiation sources, or off-line using other equipment.

The ability to apply multiple layers of coated material and provide pre- and post-processing of the sleeve with a single piece of equipment significantly reduces handling of unfinished sleeves and therefore improves quality of the coated sleeves.

Flexibility

The flanges or mounting heads may require regular cleaning to remove coating formulation residues from end-to-end coating processes or from replenishing and draining the coating collar at the flange or mounting head (i.e. home position). A coating repelling layer on the flanges or mounting heads may facilitate this cleaning.

Only if a different size of sleeve is to be coated, different flanges or mounting heads may be installed and the annular seal of the coating collar may be changed or adjusted to match with the new sleeve diameter. An example of an adjustable annular seal is an adjustable iris diaphragm including overlapping sealing leaves wherein the diaphragm opening, i.e. the aperture, is adjustable through adjustment of the position of the leaves relative to each other, as known in photography. The higher the number of leaves in the iris diaphragm, the better the sealing property of the iris diaphragm around the peripheral surface of the sleeve. Another embodiment of an adjustable annular seal is an inflatable tube allowing the internal diameter of the tube to be adjusted by inflating or deflating the tube.

Both embodiments also allow a stepwise increase of the internal diameter of the annular sleeve as the thickness of the coated layer stepwise increases with additional layers of coated material in a multiple pass operation, i.e. the internal diameter of the annular sleeve may be adjusted after each coating step (when the coating stage is at the lower flange or mounting head) and before moving the coating assembly upward again in a sliding contact with the just coated and intermediately cured layer of coating material.

Adjustable annular seals may also allow a mode of operation wherein there is no sliding contact between the coating collar and the sleeve during the upward movement of the coating assembly. For this mode of operation to be used, the coating collar is filled with the coating formulation when the coating stage is positioned at the upper flange or mounting head and after adjusting the internal diameter of the annular squeegee to fit the external diameter of the sleeve. After a first downward coating operation, when the coating stage is at the lower flange or mounting head, the coating collar is drained and the internal diameter of the annular seal is increased so as to create enough play between the annular seal and the just coated and intermediate cured layer of coating material during an upward movement of the coating stage. Once the coating stage is again at the upper flange or mounting head, the internal diameter of the annular sleeve is decreased to fit with the increased external diameter of the already partially coated sleeve and the coating collar is replenished with the same or a different coating formulation. The previous steps are repeated until the full coating profile is applied.

On-Demand Production and Sleeve Tagging

The flexibility offered by a coating device according to the invention allows for a personalized design of flexographic sleeve blanks, as far as parameters as sleeve size, coating layer thickness, functional layer setup, post-treatment etc. concern. Flexographic sleeve blanks can therefore be produced on-demand. In on-demand production, it is of major importance that specifications and/or production parameters of each coated sleeve be traceable. One way of implementing this requirement is by tagging each sleeve. Particular embodiments of tags on printing blanks and printing masters have been disclosed in EP-A-1 679 549 to Du Pont de Nemours and EP 0 962 824 to Agfa Corporation. The first reference discloses a photoluminescent tag incorporated in the printing blank, whereas the latter reference uses a slug line written or engraved on the printing master outside of the image area.

If rewritable tags are used, e.g. RFID tags, the tag may be attached onto the sleeve core before coating. The coating may then be applied on top of the tag such that the tag is encapsulated in the coating layer. The tag is then (re)written after coating.

Alternatively, a 2D/3D bar code or label may be written into the coated layer through laser marking, provided this marking is outside the image area.

The data contained in the tag may include items related to the printing blank (not engraved coated sleeve) as well as the printing master (engraved sleeve). Printing blank data may be: manufacturer identification, client, layer thickness, sleeve dimensions, shore hardness (if applicable per identifiable layer), coating solution identification, production date, type of sleeve core, etc. Printing master data may include: job identification, time stamp of job completion, engraving engine identification, operator identification, user-defined graphics as for example a client's logo. If the tag is rewritable, data may be added as the production process from sleeve core to printing master proceeds.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A coating device for coating a peripheral surface of a sleeve body with a radiation curable coating formulation, the coating device comprising:

a vertical support column arranged to support the sleeve body in a vertical position coaxial with a coating axis; and a coating stage including a carriage arranged to slide along the vertical support column, and an annular coating collar mounted on the carriage and arranged to move therewith, the annular coating collar arranged to contain the coating formulation and coat a layer of the coating formulation onto the peripheral surface of the sleeve body during a sliding movement of the carriage along the vertical support column, the annular coating collar being positioned coaxial with the coating axis; wherein the coating device includes an irradiation stage arranged to move with the coating stage and provide radiation to at least partially cure the layer of the coating formulation onto the peripheral surface of the sleeve body; and the irradiation stage includes at least one radiation source arranged around the sleeve body, and a rotating device arranged to spin the at least one radiation source around the sleeve body to irradiate the layer of the coating formulation formed on the peripheral surface of the sleeve body.

2. The coating device according to claim 1, wherein the at least one radiation source includes an ultraviolet light emitting diode.

3. A coating device for coating a peripheral surface of a sleeve body with a radiation curable coating formulation, the coating device comprising:

a vertical support column arranged to support the sleeve body in a vertical position coaxial with a coating axis; and a coating stage including a carriage arranged to slide along the vertical support column, and an annular coating collar mounted on the carriage and arranged to move therewith, the annular coating collar arranged to contain the coating formulation and coat a layer of the coating formulation onto the peripheral surface of the sleeve body during a sliding movement of the carriage along the vertical support column, the annular coating collar being positioned coaxial with the coating axis; wherein the coating device includes an irradiation stage arranged to move with the coating stage and provide radiation to at least partially cure the layer of the coating formulation onto the peripheral surface of the sleeve body; and the irradiation stage includes an irradiation optic arranged to direct a laser beam, parallel or substantially parallel to the coating axis, onto the peripheral surface of the sleeve body, and a rotation device arranged to spin the laser beam and the irradiation optic around the coating axis thereby irradiating the layer of the coating formulation all around the peripheral surface of the sleeve body.

4. A method of coating a peripheral surface of a sleeve body with a radiation curable coating formulation, the method comprising steps of:

supporting a sleeve body in a vertical position coaxial with a coating axis;

providing an annular coating collar, supplying a radiation curable coating formulation to the annular coating collar, and moving the annular coating collar along the sleeve body in a vertical direction coaxial with the coating axis, thereby coating a layer of the coating formulation onto the peripheral surface of the sleeve body; and providing an irradiation stage and moving the irradiation stage in synchronism with the annular coating collar along the sleeve body in the vertical direction while irradiating the coated layer of the coating formulation so as to at least partially cure the layer of the coating formulation formed on the peripheral surface; wherein the step of irradiating the layer of the coating formulation includes arranging at least one radiation source around the sleeve body, spinning the at least one radiation source around the sleeve body, and providing radiation from the at least one radiation source during the spinning for irradiating the layer of the coating formulation formed on the peripheral surface of the sleeve body.

5. The coating method according to claim 4, further comprising the step of providing the sleeve with a tag including sleeve-specific production information.

6. The coating method according to claim 4, further comprising the step of laser marking the coated layer.

7. The coating method according to claim 5, further comprising the step of adding data to the tag.

8. The coating device according to claim 1, further comprising an annular radiation lock arranged between the irradiation stage and the coating stage and arranged to move with the irradiation stage and the coating stage.

9. The coating device according to claim 8, wherein the annular radiation lock includes an adjustable iris diaphragm.

10. The coating device according to claim 3, further comprising an annular radiation lock arranged between the irradiation stage and the coating stage and arranged to move with the irradiation stage and the coating stage.

11. The coating device according to claim 10, wherein the annular radiation lock includes an adjustable iris diaphragm.

12. The coating method according to claim 4, further comprising:

the step of positioning an annular radiation lock between the irradiation stage and the coating stage; and moving the annular radiation lock with the irradiation stage and the coating stage thereby shutting off the irradiation from the irradiation stage to the coating formulation.

13. The coating device according to claim 1, further comprising an annular manifold arranged to move together with, or integrated in, the irradiation stage, wherein the annular manifold adds an inert gas to a cure zone between a surface of the coating formulation and the irradiation stage.

14. The coating device according to claim 3, further comprising an annular manifold arranged to move together with, or integrated in, the irradiation stage, wherein the annular manifold adds an inert gas to a cure zone between a surface of the coating formulation and the irradiation stage.

15. The coating method according to claim 4, further comprising the step of applying an inert gas to a cure zone between a surface of the coating formulation and the irradiation stage.

16. The coating method according to claim 4, further comprising repeating the steps a plurality of times so as to apply a plurality of layers of the coating formulation on the peripheral surface of the sleeve body.

17. The coating method according to claim 16, wherein at least two of the plurality of layers are coated with a different coating formulation.

* * * * *